United States Patent
Lamparter et al.

(10) Patent No.: US 11,309,906 B2
(45) Date of Patent: Apr. 19, 2022

(54) METHOD, FIELD DEVICE AND CLOUD INFRASTRUCTURE FOR DATA ACQUISITION

(71) Applicant: Siemens Aktiengesellschaft, Munich (DE)

(72) Inventors: Steffen Lamparter, Feldkirchen (DE); Ingo Thon, Grasbrunn (DE)

(73) Assignee: SIEMENS AKTIENGESELLSCHAFT

(*) Notice: Subject to any disclaimer, the term of this patent is extended or adjusted under 35 U.S.C. 154(b) by 272 days.

(21) Appl. No.: 16/629,354

(22) PCT Filed: Jul. 17, 2017

(86) PCT No.: PCT/EP2017/068011
§ 371 (c)(1),
(2) Date: Jan. 8, 2020

(87) PCT Pub. No.: WO2019/015738
PCT Pub. Date: Jan. 24, 2019

(65) Prior Publication Data
US 2021/0135684 A1   May 6, 2021

(51) Int. Cl.
H03M 13/00        (2006.01)
H03M 7/30         (2006.01)
H04L 67/1097      (2022.01)

(52) U.S. Cl.
CPC ...... *H03M 7/3059* (2013.01); *H04L 67/1097* (2013.01)

(58) Field of Classification Search
CPC ............ H03M 7/30; H03M 7/40; H03M 7/42; H03M 7/3086; H03M 5/00; H03M 7/00;
(Continued)

(56) References Cited

U.S. PATENT DOCUMENTS 7,190,284 B1   3/2007  Dye et al.
9,862,049 B2 * 1/2018  Becker ................ B23K 9/1062
(Continued)

OTHER PUBLICATIONS

MD. Tanvir Rahman et al: "Efficient Sensor-Cloud Communication using Data Classification and Compression", International Journal of Information Technology and Computer Science, vol. 9, No. 6, pp. 9-17, XP055460683, ISSN: 2074-9007, DOI: 10.5815/ijitcs.2017. 06.02, p. 9-p. 12; 2017.
(Continued)

*Primary Examiner* — Linh V Nguyen
(74) *Attorney, Agent, or Firm* — Schmeiser, Olsen & Watts LLP

(57) ABSTRACT

A sensor data are compressed on field devices using a representation is provided. The field device immediately decompresses the compressed data in order to detect a deviation. If there is a deviation, then a cloud storage receives the sensor data as raw uncompressed data. A cloud component receives a trigger signal from the field device, indicating that the representation used by the field device for compression does not sufficiently describe the sensor data. The cloud component then learns a new representation by retrieving and analyzing all data stored in the cloud storage. The method and field device provide robust, compression-based data acquisition. They improve quality and precision of the data captured by the field devices. As the representation in the field device can be updated, it becomes possible to accommodate changes in the device setup. The cloud infrastructure provides automatic learning of the representation in the cloud.

22 Claims, 3 Drawing Sheets

Figure 1:
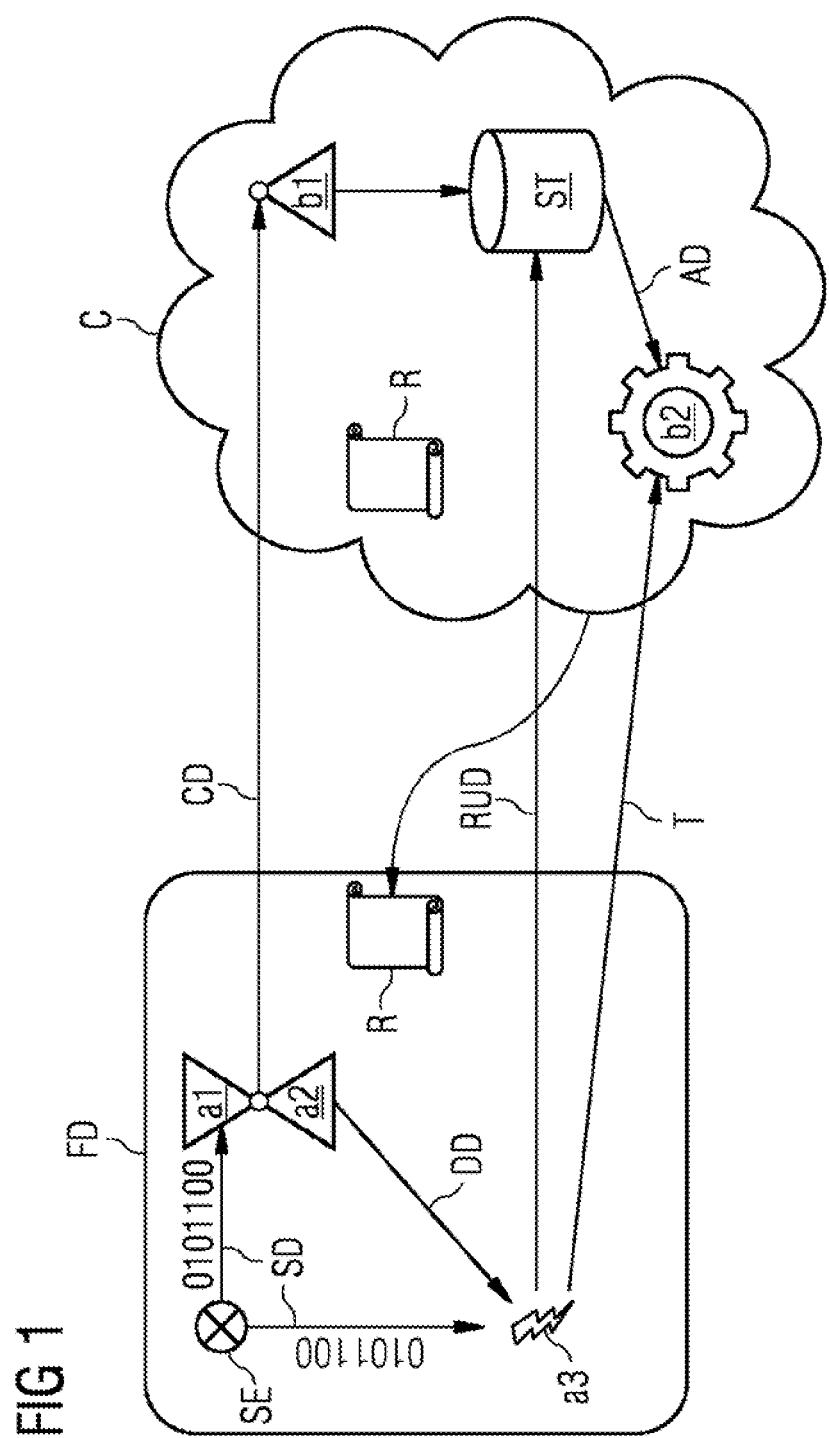

(58) Field of Classification Search
CPC ............. H03M 7/3059; H03M 7/3079; H03M 7/6023; H03M 7/6029; H03M 7/3084; H03M 7/3057; H04L 27/2626; H04L 27/2627; H04L 27/2649; H04L 27/36; H04L 67/1097; H04L 67/12
USPC ............................................... 341/50, 87, 94
See application file for complete search history.

(56) References Cited

U.S. PATENT DOCUMENTS

| | | | |
|---|---|---|---|
| 9,929,748 B1* | 3/2018 | Gopal | H03M 7/6005 |
| 9,977,425 B1* | 5/2018 | McCann | B33Y 10/00 |
| 2017/0077964 A1* | 3/2017 | Guilford | H03M 7/6041 |
| 2018/0005139 A1* | 1/2018 | Dhanyamraju | G08B 21/18 |
| 2018/0006913 A1* | 1/2018 | Asenjo | H04L 41/0631 |
| 2019/0109600 A1* | 4/2019 | Liaghati | H03M 7/40 |
| 2019/0324430 A1* | 10/2019 | Herzog | G07C 5/006 |
| 2020/0007156 A1* | 1/2020 | Fenney | G06T 1/60 |

OTHER PUBLICATIONS

Zhang Wei et al: "Mobile cloud computing with voltage scaling and data compression", 2017 IEEE 18th International Workshop on Signal Processing Advances in Wireless Communications (SPAWC), IEEE, pp. 1-5, XP033286547, DOI: 10.1109/SPAWC.2017.8227788, [retrieved on Dec. 19, 2017], abstract paragraph [000I] - paragraph [0III]; 2017.

Abhijit Choudhury et al: "A brief Survey on Data Integrity and Compression in Cloud Computing", International Journal of Computer Applications, vol. 156, No. 13, pp. 40-44, XP055460959, DOI: 10.5120/ijca2016912572, abstract paragraph [001.; 2016.

Quoc V Le: "A Tutorial on Deep Learning Part 2: Autoencoders, Convolutional Neural Networks and Recurrent Neural Networks", XP055399817, Retrieved from the Internet: URL:http://cs.stanford.edu/-quocle/tutorial2.pdf, p. 1-p. 4; 2015.

PCT International Search Report & Written Opinion dated Apr. 6, 2018 corresponding to PCT International Application No. PCT/EP2017/068011 filed Jul. 17, 2017.

* cited by examiner

METHOD, FIELD DEVICE AND CLOUD INFRASTRUCTURE FOR DATA ACQUISITION

CROSS-REFERENCE TO RELATED APPLICATIONS

This application claims priority to PCT Application No. PCT/EP2017/068011, having a filing date of Jul. 17, 2017, the entire contents of which are hereby incorporated by reference.

FIELD OF TECHNOLOGY

Industrial automation deals with very large amounts of plant floor data, which is captured from programmable logic controllers (PLC) and eventually passed to a Supervisory Control and Data Acquisition system (SCADA). Time-series data is sampled at successive time intervals (e.g. every 10 milliseconds). Even simple processes can potentially have hundreds or thousands of data points. Therefore, typical SCADA applications, which are primarily configured to display the data in real time, have a lot of data to track and deal with. Traditional SCADA further resorts to methods of tracking time-series data through process historians in order to analyze data subsequently.

BACKGROUND

When this data is stored in cloud platforms like Siemens Sinalytics, Siemens MindSphere or GE Predix, it requires a lot of bandwidth. To store and transmit the data efficiently, it needs to be compressed. In general, there are two kinds of compressions: lossless and lossy compression. The former typically results in large amounts of data. The latter one allows for more compact compression and also the compression process is more resource efficient, however, at the price of not being able to fully reconstruct the original data.

SUMMARY

According to the method for data acquisition, the following steps are executed:
  acquiring, by a sensor of a field device, sensor data,
  compressing, by a data compressor of the field device using a representation, the sensor data to generate compressed data,
  decompressing, by a data decompressor of the field device using the representation, the compressed data to generate decompressed data, and
  comparing, by a comparison unit of the field device, the sensor data with the decompressed data, and detecting a deviation if a difference between the sensor data and the decompressed data exceeds a threshold.

The field device is configured for acquiring sensor data from at least one sensor. It comprises
  a data compressor, configured for compressing, using a representation, the sensor data to generate compressed data,
  a data decompressor, configured for decompressing, using the representation, the compressed data to generate decompressed data, and
  a comparison unit, configured for comparing the sensor data with the decompressed data, and detecting a deviation if a difference between the sensor data and the decompressed data exceeds a threshold.

The cloud infrastructure comprises
  a cloud storage, configured for receiving sensor data as raw uncompressed data from at least one field device,
  a second cloud component, configured for
    receiving a trigger signal from a field device, the trigger signal indicating that a representation used by the field device for compression of sensor data does not sufficiently describe the sensor data, and
    learning a new representation by retrieving and analyzing all data stored in the cloud storage.

The following advantages and explanations are not necessarily the result of the object of the independent claims. Rather, they may be advantages and explanations that only apply to certain embodiments or variants.

As an example, the data compressor, data decompressor, and comparison unit can be implemented using one or more dedicated hardware components, e.g. an Application Specific Integrated Circuit (ASIC) or suitable software running on one or more processors, such as a microcontroller or a microprocessor.

The method and field device provide robust, compression-based data acquisition. They improve quality and precision of the data captured by the field devices. As the representation in the field device can be updated, it becomes possible to accommodate changes in the device setup.

The cloud infrastructure provides automatic learning of the representation in the cloud. This benefits from utilizing all historic data of all field devices and saves resources on the field devices. The cloud infrastructure deals with the limited computational power available on field devices by learning the new representation in the cloud. The cloud infrastructure uses automated representation learning to tailor compression algorithms towards the data at hand and continuously adapts the representation, if data characteristics change. For learning the new representation, cloud-based Big Data technology can be utilized towards building a new representation that can be automatically redeployed to the field devices. This redeployment reduces configuration effort and required domain knowledge as compression algorithms and parameters do not have to be specified manually by line builders or end users. Furthermore, changes in the environment can be automatically accommodated.

In an embodiment of the method, the method comprises the additional steps of
  sending the compressed data to a first cloud component, and
  decompressing, by the first cloud component using the representation, the compressed data, and storing the decompressed data in a cloud storage.

The representation used by the first cloud component can be a separate instance that is identical to the representation used by the field device.

In an embodiment of the method, the method comprises the additional step of sending the sensor data as raw uncompressed data to a cloud storage, if the comparison unit detects a deviation.

This embodiment allows for storing a representative sample of the sensor data generated on the device as raw uncompressed data into a cloud infrastructure utilizing the available bandwidth optimally. This is crucial in infrastructures with limited data bandwidth, and high data rates (due to high sampling or high amount of sensors). In normal operation, only compressed data are transmitted to save bandwith. Only in case of a deviation, the raw uncompressed data are transmitted.

The raw uncompressed data can be used to improve the quality of the asset data. By detecting the deviation, the field device can notice compression errors automatically. This prevents false data from being forwarded to subsequent SCADA, IVIES and asset management systems.

Transmitting the raw uncompressed data ensures that a representative sample of all data is available in the cloud.

Another advantage lies in the fact that the raw uncompressed data represents data which is uncommon and allows for adapting the representation used in the compression algorithm.

In an embodiment of the method, the method comprises the additional steps of
sending the sensor data as raw uncompressed data to the cloud storage, and
replacing decompressed data that was stored by the first cloud component with the raw uncompressed data in the cloud storage, if the comparison unit detects a deviation.

This embodiment ensures that the error between the sensor data and the data stored in the cloud never exceeds a predefined threshold.

In an embodiment of the method, the method comprises the additional steps of
learning, by a second cloud component, a new representation, by retrieving and analyzing all data stored in the cloud storage, and
replacing the representation used by the data compressor and the data decompressor with the new representation, if the comparison unit detects a deviation.

In other words, the new representation is automatically deployed like an app from the cloud to the field devices.

In a variant of this embodiment, the representation used by the first cloud component is also replaced with the new representation if the comparison unit (a3) detects a deviation.

In an embodiment of the method, the method comprises the additional step of triggering an alarm on the field device, if the comparison unit detects a deviation.

This—that the field device can warn in case of abnormal behavior indicated by uncommon data. In other words, the method provides an automated device protection.

In an embodiment of the method, many field devices send data to the cloud storage.

In an embodiment of the method, the method comprises the additional steps of
creating multiple new representations if the data in the cloud storage are heterogeneous, and
deploying one of the multiple representations to each of the field devices.

In an embodiment of the method, the data compressor and data decompressor are parts of a neural autoencoder.

In an embodiment of the method, the learning of the new representation comprises using a back-propagation algorithm or a Limited-memory Broyden-Fletcher-Goldfarb-Shannon algorithm.

In an embodiment of the method, the learning of the new representation comprises using weight decaying or a sparsity autoencoder.

In an embodiment of the field device, the field device comprises a network interface and is configured for sending the compressed data to a cloud, in particular to a first cloud component.

In an embodiment of the field device, the field device comprises a network interface and configured for sending the sensor data as raw uncompressed data to a cloud storage, if the comparison unit detects a deviation.

In an embodiment of the field device, the field device is configured for generating an alarm if the comparison unit detects a deviation.

In an embodiment of the cloud infrastructure, the cloud infrastructure comprises a first cloud component, configured for
receiving compressed data from the field device,
decompressing the compressed data using a representation stored in the cloud, and
storing decompressed data in the cloud storage.

The cloud storage is configured for overwriting decompressed data with corresponding raw uncompressed data in case raw uncompressed data are received.

The first cloud component and second cloud component can be implemented using dedicated hardware components or suitable software running on one or more processors or servers. The representation used by the first cloud component can be a separate instance that is identical to the representation used by the field device.

In an embodiment of the cloud infrastructure, the cloud infrastructure is connected to several field devices. The second cloud component is configured for creating multiple new representations if the data in the cloud storage are heterogeneous, and deploying one of the multiple new representations to each of the field devices.

The network for data acquisition comprises the cloud infrastructure and several field devices.

The computer-readable storage media has stored thereon instructions executable by one or more processors of a computer system, wherein execution of the instructions causes the computer system to perform the method.

The computer program is being executed by one or more processors of a computer system and performs the method.

BRIEF DESCRIPTION

Figure 2:
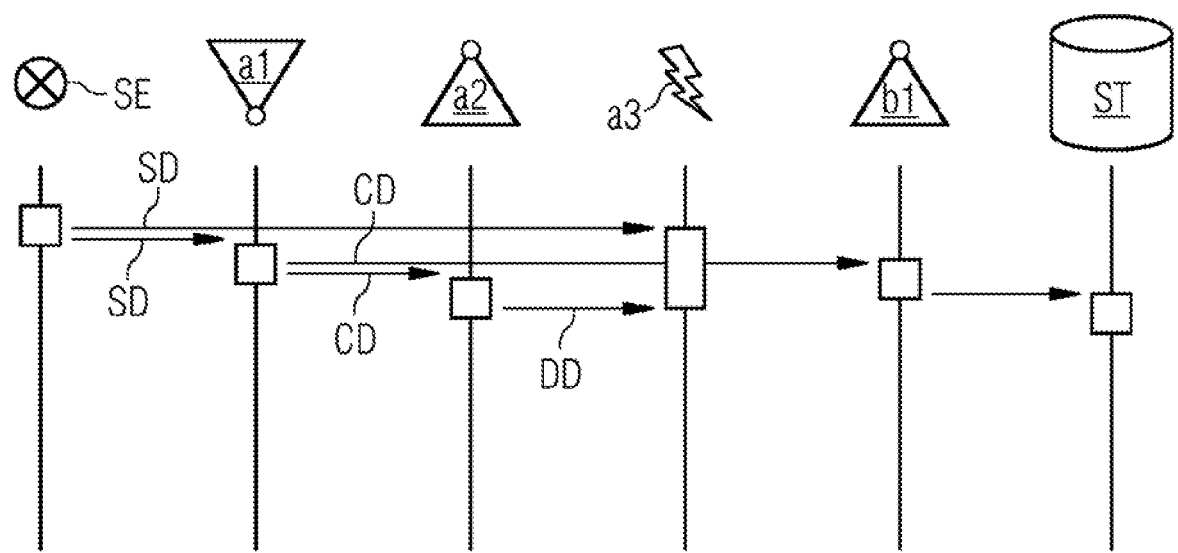
Figure 3:
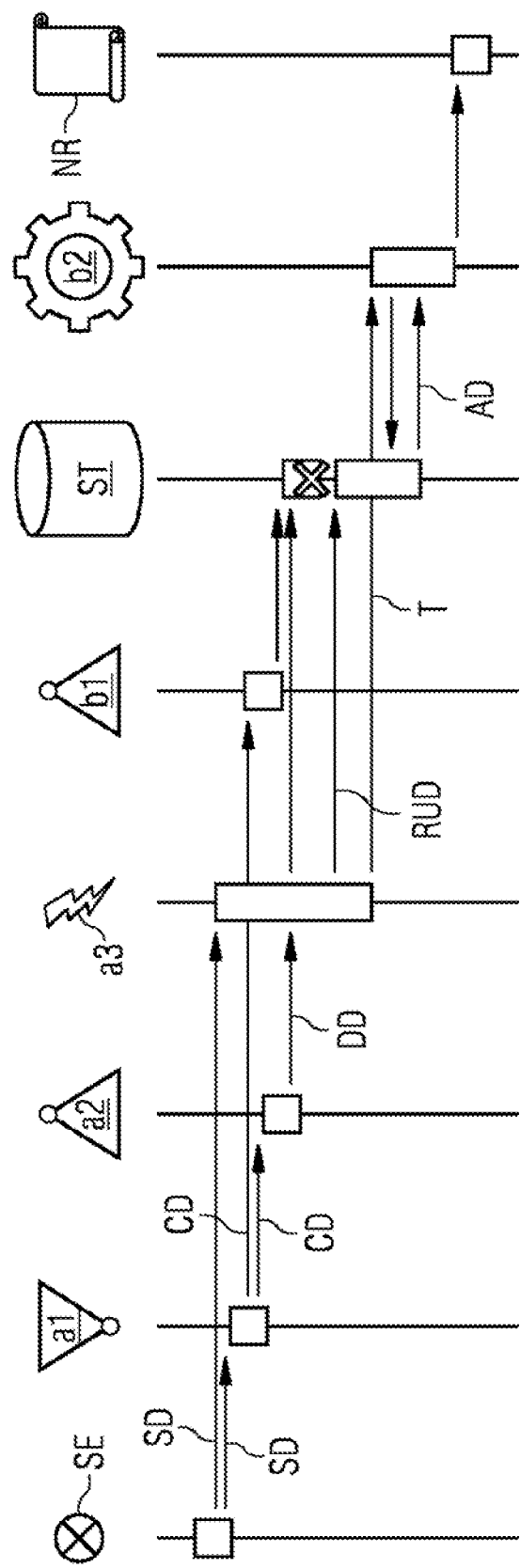

Some of the embodiments will be described in detail, with reference to the following figures, wherein like designations denote like members, wherein:
FIG. 1 shows a field device FD connected to a cloud C;
FIG. 2 shows a control flow for normal operation; and
FIG. 3 shows a control flow for learning a new representation NR.

DETAILED DESCRIPTION

FIG. 1 shows a field device FD connected to a cloud C. Many more field devices, for example PLCs, can be connected in the same manner to the cloud C.

The field device FD receives sensor data SD from at least one sensor SE that is either part of the field device FD or connected to the field device FD. The field device FD contains a data compressor a1, for example a compression algorithm, which sends compressed data CD to a first cloud component b1 and a data decompressor a2 within the field device FD. The data decompressor a2 immediately decompresses the compressed data CD into decompressed data DD. A comparison unit a3 matches the decompressed data DD onto the original stream of the sensor data SD.

The algorithms used by the data compressor a1 and the data decompressor a2 need to be consistent. While there is potentially a wide choice of algorithms (both lossless and lossy) available, it is crucial that they both utilize a representation R which tailors the algorithm typical in the application domain. It must be possible to learn the representation R from data. One example for implementing the data compressor a1 and the data decompressor a2 is a neural autoencoder. A neural autoencoder is a neural network which projects input data onto a lower dimensional space and the projected data back to the original space. In this example, the parameters of this neural network are the representation R.

In a possible embodiment, the data compressor a1 is the part of the neural autoencoder projecting the sensor data SD onto the lower dimensional space, in order to generate the compressed data CD. The data decompressor a2 is the second half of the neural autoencoder which projects the compressed data CD back to the original space, in order to generate the decompressed data DD.

The comparison unit a3 needs to implement a metric which measures the difference between the sensor data SD and the decompressed data DD. An example for such a metric is the percentage of error. In that case, a deviation is detected by the comparison unit a3 if the percentage of error exceeds a given threshold.

If the comparison unit a3 detects a deviation, it means that the representation R does not sufficiently describe the sensor data SD. The field device FD captures a snapshot of the sensor data SD and stores it locally, e.g. on a SD-card. The field device FD then uploads the snapshot as raw uncompressed data RUD into a cloud storage ST, e.g. via JSON. Finally, the field device FD triggers a second cloud component b2, e.g. via TCP/IP protocol using a standard HTTP/GET, thereby informing the second cloud component b2 that the representation R does not sufficiently describe the sensor data SD.

The first cloud component b1 receives the compressed data CD sent from the field device FD and stores it decompressed in the cloud storage ST. For consistency reasons, the first cloud component b1 needs to be identical to the data compressor decompressor a2 of the field device FD. The cloud storage ST is a cloud/data storage component. The cloud storage ST can, for example, be a simple network attached file system or a Hadoop cluster.

A second cloud component b2 stays mostly inactive. Only in case it is triggered by the field device FD, it retrieves all data AD, that is all the decompressed data from the cloud storage ST and automatically builds a new representation NR for the compression/decompression algorithm used by the data compressor a1, the data decompressor a2, and the first cloud component b1. In case the data compressor a1, the data decompressor a2, and the first cloud component b1 is implemented as a neural autoencoder, the second cloud component b2 can use, for example, the back-propagation or the L-BFGS algorithm. To achieve a sparse representation during learning, various techniques can be employed, for example weight decaying or a sparsity autoencoder.

Despite FIG. 1 showing only a single field device FD, many field devices can be configured as described above and be connected to the cloud C. The second cloud component b2 can optionally decide to build the new representation NR for only a subset of the field devices, if the data in the cloud storage are too heterogeneous. In that case, different representations are deployed on different field devices. The first cloud component b1 is then made aware of the different representations used and matches them with the devices sending the data.

Another embodiment omits sending the compressed data CD from the field device FD to the cloud C. In that embodiment, the first cloud component b1 and the representation R are omitted in the cloud. That embodiment only stores all data in the cloud which is sufficiently different from the observed data and a representative sample of all data can be maintained.

FIG. 2 shows a control and information flow during normal operation for the embodiments described above. A Sensor SE generates chunks of data as sensor data SD. A chunk is a series of measurements, e.g., a micro-batch. However, the sensor SE can also produce a stream of sensor data SD that is processed with stream processing techniques.

During normal operation, a representation R fits the sensor data SD. The sensor SE continuously streams the sensor data SD it generates to both a data compressor a1 and a comparison unit a3 in the field device. The sensor data SD is then compressed by the data compressor a1 utilizing the representation R. Compressed data CD is fed in parallel into a data decompressor a2 and a first cloud component b1. The data decompressor a2 decompresses the compressed data CD and forwards decompressed data DD to the comparison unit a3, which will not detect a deviation in the first case and terminate the process in the field device for the current data chunk. In parallel, the first cloud component b1 will decompress the received compressed data CD and store it in the cloud storage ST.

FIG. 3 shows a control and information flow for learning of a new representation NR. In this second case, the process is to a large extent similar. The sensor SE continuously streams the sensor data SD to both the data compressor a1 and the comparison unit a3. The sensor data SD is then compressed by the data compressor a1 utilizing the representation R. Compressed data CD is fed in parallel into the data decompressor a2 and a first cloud component b1. The data decompressor a2 decompresses the compressed data CD and forwards decompressed data DD to the comparison unit a3, which will in this case detect a deviation between the decompressed data DD and the sensor data SD. In parallel, the first cloud component b1 will decompress the received compressed data CD and store it in the cloud storage ST.

In the case shown in FIG. 3, the comparison unit a3 detects a difference between the sensor data SD and the decompressed data DD exceeds a predefined threshold. First it replaces the decompressed data in the cloud storage ST with the original data, that is the sensor data SD, by sending the sensor data SD as raw uncompressed data RUD to the cloud storage ST. Once this has happened, the comparison unit a3 triggers the learning of a new representation by sending a trigger signal T to the second cloud component b2, which retrieves all data AD from the cloud storage ST. This data is then utilized to learn a new representation NR. This new representation NR is stored both on the field device FD and in the cloud C to be utilized in the future by the data compressor a1, the data decompressor a2 and the first cloud component b1.

Optionally, besides triggering the upload of the raw uncompressed data RUD, the system can also trigger an alarm on the field device. The rationale behind this is that if the sensor data cannot be compressed anymore it indicates an atypical behavior of the field device.

The method can be executed by a processor such as a microcontroller or a microprocessor, by an Application Specific Integrated Circuit (ASIC), by any kind of computer, including mobile computing devices such as tablet computers, smartphones or laptops, or by one or more servers in a control room or cloud.

For example, a processor, controller, or integrated circuit of the computer system and/or another processor may be configured to implement the acts described herein.

The above-described method may be implemented via a computer program product (non-transitory computer readable storage medium having instructions, which when executed by a processor, perform actions) including one or more computer-readable storage media having stored thereon instructions executable by one or more processors of a computing system. Execution of the instructions causes the computing system to perform operations corresponding with the acts of the method described above.

The instructions for implementing processes or methods described herein may be provided on non-transitory computer-readable storage media or memories, such as a cache, buffer, RAM, FLASH, removable media, hard drive, or other computer readable storage media. Computer readable storage media include various types of volatile and nonvolatile storage media. The functions, acts, or tasks illustrated in the figures or described herein may be executed in response to one or more sets of instructions stored in or on computer readable storage media. The functions, acts or tasks may be independent of the particular type of instruction set, storage media, processor or processing strategy and may be performed by software, hardware, integrated circuits, firmware, micro code and the like, operating alone or in combination. Likewise, processing strategies may include multiprocessing, multitasking, parallel processing and the like.

The embodiments have been described in detail with reference to embodiments thereof and examples. Variations and modifications may, however, be effected within the spirit and scope of embodiments of the invention covered by the claims. The phrase "at least one of A, B and C" as an alternative expression may provide that one or more of A, B and C may be used.

Although the present invention has been disclosed in the form of preferred embodiments and variations thereon, it will be understood that numerous additional modifications and variations could be made thereto without departing from the scope of the intention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for data acquisition,
with the following steps:
acquiring, by a sensor of a field device, sensor data,
compressing, by a data compressor of the field device using a representation, the sensor data to generate compressed data,
decompressing, by a data decompressor of the field device using the representation, the compressed data to generate decompressed data, and
comparing, by a comparison unit of the field device, the sensor data with the decompressed data, and detecting a deviation if a difference between the sensor data and the decompressed data exceeds a threshold.

2. The method according to claim 1, with the additional steps of
sending the compressed data to a first cloud component, and
decompressing, by the first cloud component using the representation, the compressed data, and storing the decompressed data in a cloud storage.

3. The method according to claim 1, with the additional step of
sending the sensor data as raw uncompressed data to a cloud storage, if the comparison unit detects a deviation.

4. The method according to claim 2, with the additional step of
sending the sensor data as raw uncompressed data to the cloud storage, and
replacing decompressed data that was stored by the first cloud component with the raw uncompressed data in the cloud storage,
if the comparison unit detects a deviation.

5. The method according to claim 3, with the additional steps of
learning, by a second cloud component, a new representation, by retrieving and analyzing all data stored in the cloud storage, and
replacing the representation used by the data compressor and the data decompressor with the new representation, if the comparison unit detects a deviation.

6. The method according to claim 4, with the additional steps of
learning, by a second cloud component, a new representation, by retrieving and analyzing all data stored in the cloud storage, and
replacing the representation used by the data compressor, the data decompressor and the first cloud component, with the new representation, if the comparison unit detects a deviation.

7. The method according to claim 1, with the additional step of
triggering an alarm on the field device, if the comparison unit detects a deviation.

8. The method according to claim 2,
with many field devices sending data to the cloud storage.

9. The method according to claim 8,
wherein the second cloud component creates multiple new representations if the data in the cloud storage are heterogeneous, and
wherein the second cloud component deploys one of the multiple representations to each of the field devices.

10. The method according to claim 1, with the data compressor and data decompressor being parts of a neural autoencoder.

11. The method according to claim 5,
wherein the learning of the new representation comprises using a back-propagation algorithm or a Limited-memory Broyden-Fletcher-Goldfarb-Shannon algorithm.

12. The method according to claim 10,
wherein the learning of the new representation comprises using weight decaying or a sparsity autoencoder.

13. A field device,
configured for acquiring sensor data from at least one sensor,
with a data compressor, configured for compressing, using a representation, the sensor data generate compressed data,
with a data decompressor, configured for decompressing, using the representation, the compressed data to generate decompressed data, and
with a comparison unit, configured for comparing the sensor data with the decompressed data, and detecting a deviation if a difference between the sensor data and the decompressed data exceeds a threshold.

14. The field device according to claim 13,
with a network interface and configured for sending the compressed data to a cloud, in a first cloud component.

15. The field device according to claim 13,
with a network interface and configured for sending the sensor data as raw uncompressed data to a cloud storage, if the comparison unit detects a deviation.

16. The field device according to claim 13,
configured for generating an alarm if the comparison unit detects a deviation.

17. A cloud infrastructure,
with a cloud storage, configured for receiving sensor data as raw uncompressed data from at least one field device,
with a second cloud component, configured for
  receiving a trigger signal from a field device, the trigger signal indicating that a representation used by the field device for compression of sensor data does not sufficiently describe the sensor data, and
  learning a new representation by retrieving and analyzing all data stored in the cloud storage.

18. The cloud infrastructure according to claim 17,
with a first cloud component configured for
  receiving compressed data from the field device,
  decompressing the compressed data using a representation stored in the cloud, and
  storing decompressed data in the cloud storage;
wherein the cloud storage is configured for overwriting decompressed data with corresponding raw uncompressed data in case raw uncompressed data are received.

19. The cloud infrastructure according to claim 17,
connected to several field devices, and
wherein the second cloud component is configured for
  creating multiple new representations the data in the cloud storage are heterogeneous, and
  deploying one of the multiple new representations to each of the field devices.

20. A network for data acquisition,
with a cloud infrastructure according to claim 17 and with several field devices.

21. A computer-readable storage media having stored thereon:
instructions executable by one or more processors of a computer system, wherein execution of the instructions causes the computer system to perform the method according to claim 1.

22. A computer program,
which is being executed by one or more processors of a computer system and performs the method according to claim 1.

* * * * *